(12) United States Patent
Ahn

(10) Patent No.: US 7,045,896 B2
(45) Date of Patent: May 16, 2006

(54) METAL INTERCONNECT LAYER OF SEMICONDUCTOR DEVICE AND METHOD FOR FORMING A METAL INTERCONNECT LAYER

(75) Inventor: Jong-hyon Ahn, Suwon (KR)

(73) Assignee: Samsung Electronics Co., Ltd., (KR)

( * ) Notice: Subject to any disclaimer, the term of this patent is extended or adjusted under 35 U.S.C. 154(b) by 132 days.

(21) Appl. No.: 10/738,727

(22) Filed: Dec. 17, 2003

(65) Prior Publication Data

US 2004/0140563 A1 Jul. 22, 2004

Related U.S. Application Data

(62) Division of application No. 09/879,556, filed on Jun. 12, 2001, now abandoned.

(30) Foreign Application Priority Data

Nov. 1, 2000 (KR) ............................... 2000-64557

(51) Int. Cl.
    *H01L 29/40* (2006.01)
(52) U.S. Cl. ...................................... 257/758; 257/774
(58) Field of Classification Search ................ 257/758, 257/759, 763, 774; 758/758, 763, 759
    See application file for complete search history.

(56) References Cited

U.S. PATENT DOCUMENTS 5,442,236 A * 8/1995 Fukazawa .................... 257/758
6,737,748 B1 * 5/2004 Bauch et al. ................ 257/763

* cited by examiner

*Primary Examiner*—Roy Potter
(74) *Attorney, Agent, or Firm*—Mills & Onello LLP

(57) ABSTRACT

A metal interconnect layer of a semiconductor device, and a method for forming a metal interconnect layer of a semiconductor device are provided. The lower portion of a metal interconnect layer is wider than the upper portion of the metal interconnect layer. In another interconnect structure in accordance with the invention, the middle portion of the metal interconnect layer is wider than the upper and lower portions of the metal interconnect layer.

11 Claims, 9 Drawing Sheets

US 7,045,896 B2

METAL INTERCONNECT LAYER OF SEMICONDUCTOR DEVICE AND METHOD FOR FORMING A METAL INTERCONNECT LAYER

RELATED APPLICATIONS

This application is a divisional of U.S. application Ser. No. 09/879,556, filed on Jun. 12, 2001, abandoned the contents of which are incorporated herein in their entirety by reference.

BACKGROUND OF THE INVENTION

1. Field of the Invention

The present invention relates to a semiconductor device and a method for manufacturing the same, and more particularly, to a metal interconnect layer of a semiconductor device and a method for forming the metal interconnect layer.

2. Description of the Related Art

For higher integration density and rapid operation of integrated circuit chips, semiconductor integration techniques have been advanced. The size of chips has been decreased with a smaller design rule to satisfy the need for high integration level. To increase the operation speed of chips, performance of transistors has been enhanced by reducing the parasitic resistance and parasitic capacitance of the transistors.

With regard to interconnection techniques for semiconductor devices, it is significant to design a high-performance transistor with a minimum resistance and parasitic capacitance, such that an RC level (resistance×capacitance) of a semiconductor device having the capacitor is low. The resistivity of copper (Cu), 1.8 μΩ-cm, is lower than that of aluminum (Al), 2.7 μΩ-cm. Due to the low resistance of Cu, there is a thickness reduction effect when a metal interconnect layer is made of Cu. For this reason, use of Cu as a material for metal interconnect has proliferated to reduce interconnection resistance and parasitic capacitance with a 0.18 μm or less design rule.

FIGS. 1 and 2 illustrate the configuration of metal interconnects formed by a conventional damascene process. For the metal interconnects shown in FIGS. 1 and 2, the conductive layers are formed of Cu. In particular, a trench is formed in an interlevel dielectric (ILD) film, and a barrier layer 16 and a conductive layer 18 are deposited in sequence, filling the trench. Then, the semiconductor wafer 10 is subjected to chemical mechanical polishing. Such processes are collectively called "damascene processes." When a metal interconnect is formed by the conventional damascene process, a lifting of the conductive layer 18 in the trench may occur due to stress applied to the ILD film 12 during a subsequent thermal process. This problem is serious when the upper width of a trench is larger than the lower width, as shown in FIG. 2. When such lifting of a metal connection occurs in a trench, the contact between a via and the metal interconnect is unsatisfactory, so that normal operation of semiconductor chips is impossible.

FIG. 3 illustrates lifting of a metal interconnect in a trench. As the trench angle (θ) in the ILD film becomes smaller, it is more likely that lifting of the conductive layer 18 will occur.

SUMMARY OF THE INVENTION

To solve the above problems, it is an object of the present invention to provide a metal interconnect layer of a semiconductor device that essentially does not lift from a trench.

It is another object of the present invention to provide a method for forming a metal interconnect layer of a semiconductor device, which can prevent lifting of the metal interconnect layer from a trench.

According to an aspect of the present invention, there is provided a metal interconnect layer of a semiconductor device. The interconnect layer includes a first upper portion having a first width and a second lower portion under the first upper portion. The lower portion has a second width which is larger than the first width of the upper portion of the interconnect.

The metal interconnect layer can include a barrier layer deposited along an interlevel dielectric (ILD) film with a trench having a lower width and an upper width, the lower width being larger or wider than the upper width. The interconnect layer can also include a conductive layer deposited over the barrier layer filling the trench, the conductive layer having a lower width and an upper width, the lower width being wider or larger than the upper width.

In one embodiment, the ILD film may be formed of a single insulation layer of a material selected from the group consisting of undoped silicate glass (USG) layer, silicon oxide fluoride (SiOF) layer, tetraethylorthosilicate (TEOS) layer, spin-on glass (SOG) layer and borophosphosilicate glass (BPSG). The thickness of an upper portion of the ILD film surrounding a portion of the trench with the upper width may be in the range of 20–70% of the thickness of the entire ILD film.

In another embodiment, the ILD film comprises first and second insulation layers deposited in sequence, the trench being formed in the ILD film such that the portion of the trench formed in the first insulation layer is wider than the portion of the trench formed in the second insulation layer. The thickness of the second insulation layer may be in the range of 20–70% of the thickness of the entire ILD film including the first and second insulation layers. The second insulation layer may be formed of a USG layer, SiOF layer, TEOS layer, SOG layer or BPSG layer, and the first insulation layer can be formed of a flowable oxide (FOX) layer or hydride organic siloxane polymer (HOSP) layer having a higher etch rate than the second insulation layer.

The barrier layer can be formed of a Ta layer, a TaN layer, a Ti layer, a TiN layer or a bilayer of these layers. The conductive layer can be formed of a Cu or a W layer.

In another aspect, the present invention provides a metal interconnect layer for a semiconductor device, which includes a first upper portion having a first width, a second middle portion having a second width and a third lower portion having a third width. The third width is wider or larger than the first and second widths.

In one embodiment, the metal interconnect layer comprises a barrier layer deposited along an ILD film with a trench having a lower width, a middle width and an upper width. The middle width is wider or larger than the upper and lower widths. The metal interconnect layer also includes a conductive layer deposited over the barrier layer filling the trench. The conductive layer has a lower width, a middle width and an upper width, the middle width being wider or larger than the upper and lower widths.

The ILD film may be formed as a single layer with a material selected from the group consisting of USG layer, SiOF layer, TEOS layer, SOG layer and BPSG layer. The thickness of a middle portion of the ILD film surrounding a portion of the trench with the larger middle width may be in the range of 20–50% of the thickness of the entire ILD film.

In another embodiment, the ILD film comprises first, second and third insulation layers deposited in sequence, the trench being formed in the ILD film such that the portion of the trench formed in the second insulation layer is wider than the portions formed in the first and third insulation layers. The thickness of the second insulation layer may be in the range of 20–50% of the thickness of the entire ILD film including the first, second and third insulation layers. Each of the first and third insulation layers may be formed of a USG layer, SiOF layer, TEOS layer, SOG layer or BPSG layer, and the second insulation layer can be formed of a FOX layer or HOSP layer having a higher etch rate than the first and third insulation layers.

According to another aspect of the present invention, there is provided a method for forming a metal interconnect layer of a semiconductor device. In accordance with the method, an ILD film is formed over a semiconductor wafer. A photoresist pattern, defining a metal interconnect region is formed on the ILD film. A portion of the ILD film is etched using the photoresist pattern as an etch mask to form an initial relatively shallow trench, resulting in a polymer layer serving as an etch barrier being formed on the sidewalls of the shallow trench. Then, the remainder of the ILD film is etched using the photoresist pattern and the polymer layer on the shallow trench sidewalls as an etch mask, thereby resulting in a deeper trench whose lower width is larger than the upper width. Then, the photoresist pattern is removed. A barrier layer is formed along the semiconductor wafer and in the trench, and then a conductive layer is deposited over the barrier layer. The conductive layer is then polished by chemical mechanical polishing (CMP), such that the conductive layer remains within only the trench.

In one embodiment, in etching a portion of the ILD film to form the initial relatively shallow trench, a hydrogen containing CF-based gas and an inert gas are used such that the polymer layer is formed on the initial trench sidewalls. In etching the remainder of the ILD film to deepen the trench, a non-hydrogen containing CF-based gas and an inert gas are used together with at oxygen and/or nitrogen.

The height of the initial trench with the polymer layer can be in the range of 20–70% of the thickness of the entire ILD film.

The ILD film can be formed of USG, SiOF, TEOS, SOG or BPSG. The barrier layer can be formed of a Ta layer, a TaN layer, a Ti layer, a TiN layer and/or a bilayer of these layers. The barrier layer acts as both a metal diffusion barrier and an adhesive layer between the ILD film and the conductive layer. The conductive layer can be formed of Cu and/or W.

In another aspect, there is provided in accordance with the invention another method for forming a metal interconnect layer of a semiconductor device. A first ILD film is formed over a semiconductor wafer. A second ILD film having a lower etch rate than the first ILD film is formed over the first ILD film. Then, a photoresist pattern, by which a metal interconnect region is defined, is formed over the second ILD film. The second ILD film and the first ILD film are etched in sequence using the photoresist pattern as an etch mask, to form a trench whose lower width in the first ILD film is larger than its upper width in the second ILD film. After removing the photoresist pattern, a barrier layer is formed along the semiconductor wafer and in the trench, and a conductive layer is deposited over the barrier layer. Then, the semiconductor wafer with the conductive layer is polished by chemical mechanical polishing such that the conductive layer remains within only the trench surrounded by the first and second ILD films.

In another aspect, there is provided in accordance with the invention another method for forming a metal interconnect layer of a semiconductor device. An ILD film is formed over a semiconductor wafer. A photoresist pattern, by which a metal interconnect region is defined, is formed on the ILD film. An upper portion of the ILD film is etched using the photoresist pattern as an etch mask to form an initial trench having a first width, resulting in a polymer layer serving as an etch barrier on the sidewalls of the initial trench. A middle portion of the ILD film is etched using the photoresist pattern and the polymer layer on the initial trench sidewalls as an etch mask, to deepen the trench to form a second portion of the trench whose width is larger than the width of the initial trench. Then, a polymer layer serving as an etch barrier is formed on the lower end of the etched middle portion of the ILD film. The remaining lower portion of the ILD film is etched using the photoresist pattern and the polymer layers on the initial trench sidewalls and the sidewalls of the second portion of the trench as an etch mask, to further deepen the trench to form a third portion of the trench having a third width, the third width being smaller than the second width of the second portion of the trench. After removing the photoresist pattern, a barrier layer is formed along the semiconductor wafer and in the deepened trench, and a conductive layer is deposited over the barrier layer. The semiconductor wafer with the conductive layer is then polished by chemical and mechanical polishing such that the conductive layer remains within only the trench surrounded by the ILD film.

In still another aspect, there is provided in accordance with the invention another method for forming a metal interconnect layer of a semiconductor device. A first interlevel dielectric (ILD) film is formed over a semiconductor wafer. A second ILD film having a higher etch rate than the first ILD film is formed over the first ILD film, and a third ILD film having a lower etch rate than the second. ILD film is formed over the second ILD film. A photoresist pattern, by which a metal interconnect region is defined, is formed over the third ILD film. Following this, the third ILD film, the second ILD film, and the first ILD film are etched in sequence using the photoresist pattern as an etch mask, to form a trench whose middle width in the second ILD film is larger than the upper width in the third ILD film and the lower width in the first ILD film. After removing the photoresist pattern, a barrier layer is formed along the semiconductor wafer and in the trench. Then, a conductive layer is deposited over the barrier layer; and the semiconductor wafer with the conductive layer is polished by chemical mechanical polishing such that the conductive layer remains within only the trench surrounded by the first, second and third ILD films.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 1:
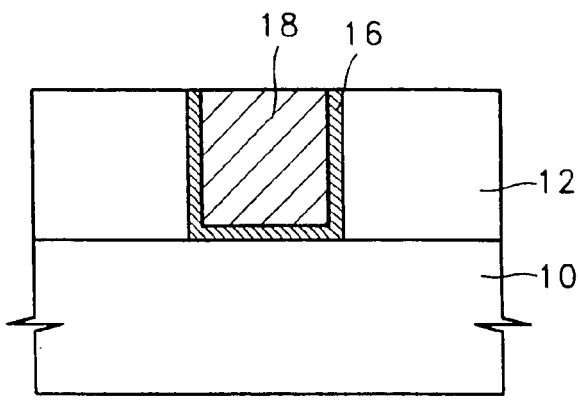
FIGS. 1 and 2 are sectional views of metal interconnects formed by a conventional damascene process.
Figure 2:
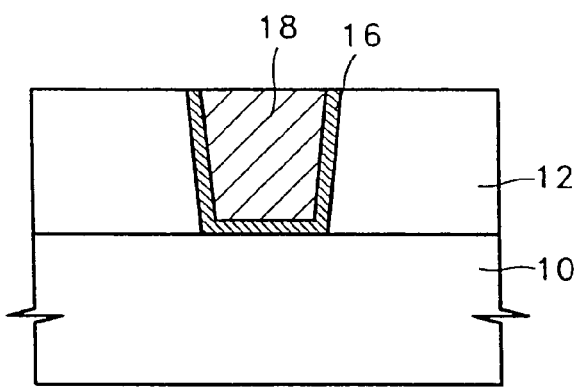
Figure 3:
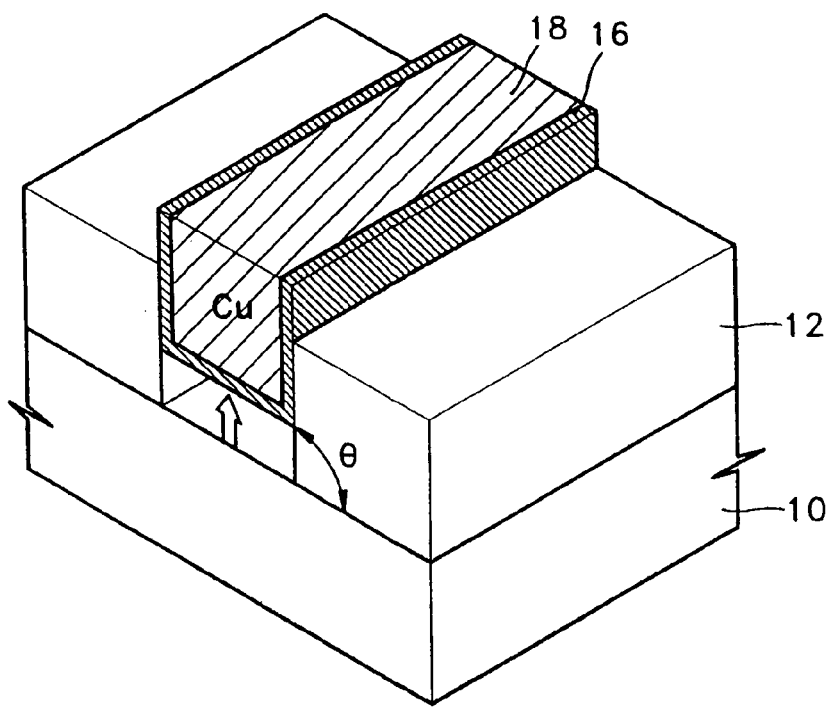
FIG. 3 is a perspective view of a conventional metal interconnect in which lifting of a metal interconnect layer occurs in a trench.

The present invention will now be described more fully with reference to the accompanying drawings, in which preferred embodiments of the invention are shown. This invention may, however, be embodied in many different forms and should not be construed as being limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present.

In the preferred embodiments described below, the upper width of a metal interconnect layer is larger than the lower width of the metal interconnect layer, or the middle width of the metal interconnect layer is larger than the upper and lower width of the metal interconnect layer. As a result, the problem of lifting of a metal interconnect layer formed by a conventional damascene process can be solved.

Preferred embodiments of a metal interconnect layer of a semiconductor device according to the present invention will be described with reference to FIGS. 4 through 7.

Embodiment 1

Figure 4:
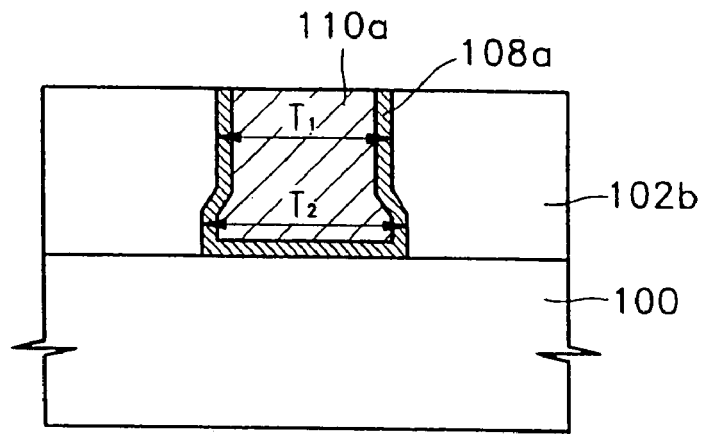
FIGS. 4 through 7 are schematic sectional views illustrating alternative embodiments of a metal interconnect layer of a semiconductor device according to the present invention.

One embodiment of a metal interconnect layer of a semiconductor device according to the present invention is shown in FIG. 4. Referring to FIG. 4, in the metal connection configuration, a trench whose lower width $T_2$ is larger than the upper width $T_1$ is formed in an interlevel dielectric (ILD) film 102b deposited over a semiconductor wafer 100, and a barrier layer 108a is formed along the trench. A sub-conductive layer 110a is deposited to fill the trench with the barrier layer 108a. As a result, the lower width of the resulting conductive layer 110a is larger than the upper width thereof. It is preferable that the thickness of the upper portion of the ILD film 102b with the relatively narrow conductive layer is about 20–70% of the thickness of the entire ILD film 102b. The ILD film 102b may be formed of a single insulation layer, such as an undoped silicate glass (USG) layer, silicon oxide fluoride (SiOF) layer, tetraethylorthosilicate (TEOS) layer, spin-on glass (SOG) layer or borophosphosilicate glass (BPSG) layer. The semiconductor wafer 100 may be a substrate as a stack of an insulation layer, such as USG layer, SiOF layer, TEOS layer, SOG layer or BPSG layer, and a silicon nitride layer formed in sequence over a predetermined underlying layer. The barrier layer 108a may be a Ta layer, TaN layer, Ti layer, TiN layer or a bilayer of these material layers. The conductive layer 110a may be formed of copper (Cu) or tungsten (W).

Embodiment 2

Figure 5:
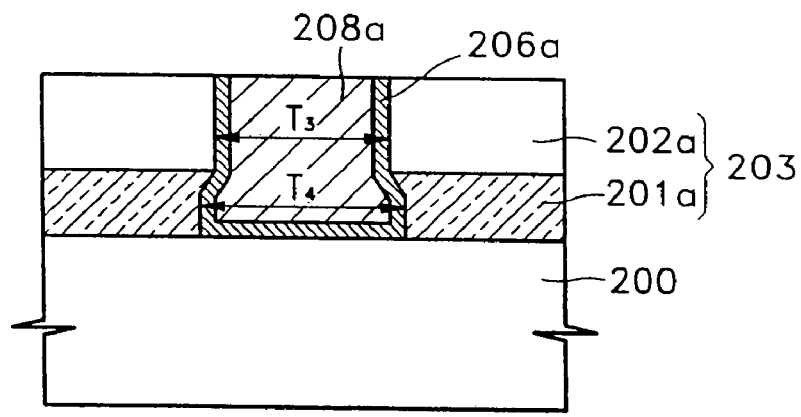

Another embodiment of a metal interconnect layer of a semiconductor device according to the present invention is shown in FIG. 5. Referring to FIG. 5, a trench whose lower width $T_4$ is larger than the upper width $T_3$ is formed in an interlevel dielectric (ILD) film 203 deposited over a semiconductor wafer 200, and a barrier layer 206a is formed along the semiconductor wafer 200 with the trench. A conductive layer 208a is deposited to fill the trench with the barrier layer 206a. As a result, the lower width of the resulting conductive layer 208 is larger than the upper width thereof. The ILD film 203 includes a first insulation layer 201a and a second insulation layer 202a, which are stacked in sequence. The relatively wide lower portion of the conductive layer 208 is located in the first insulation layer 201a, and the relatively narrow upper portion of the conductive layer 208a is located in the second insulation layer 202a. It is preferable that the thickness of the second insulation layer 202a is about 20–70% of the thickness of the entire ILD film 203. The first insulation layer 201a may be formed of a material layer such as a flowable oxide (FOX) layer or hydride organic siloxane polymer (HOSP) layer, having a higher etch rate and a smaller dielectric constant, compared with the second insulation layer 202a. The second insulation layer 202a may be formed of a material layer, such as a USG layer, SiOF layer, TEOS layer, SOG layer or BPSG layer, having a lower etch rate than the first insulation layer 201a. In the present embodiment, the semiconductor wafer 200, the barrier layer 206a and the conductive layer 208a are formed of the same materials as used in Embodiment 1 described previously.

Embodiment 3

Figure 6:
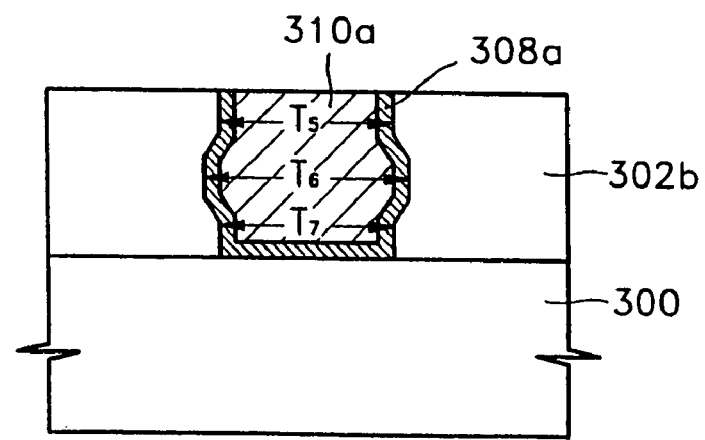

Still another embodiment of a metal interconnect layer of a semiconductor device according to the present invention is shown in FIG. 6. Referring to FIG. 6, a trench whose middle width $T_6$ is larger than the upper and lower widths $T_5$ and $T_7$ is formed in an interlevel dielectric (ILD) film 302b deposited over a semiconductor wafer 300, and a barrier layer 308a is formed along the semiconductor wafer 300 with the trench. A conductive layer 310a is deposited to fill the trench with the barrier layer 308a. As a result, the middle width of the resulting conductive layer 310a is larger than the upper and lower widths thereof. It is preferable that the thickness of the middle portion of the ILD film 302b with the widest middle portion of the conductive layer 310a be about 20–70% of the thickness of the entire ILD film 302b. The ILD film 302b may be formed of a single insulation layer such as a USG layer, SiOF layer, TEOS layer, SOG layer or BPSG layer. The semiconductor wafer 300 may be a substrate in which a silicon nitride layer is deposited over a predetermined lower layer such as a USG layer, SiOF layer, TEOS layer, SOG layer or BPSG layer. The barrier layer 308a may be a Ta layer, TaN layer, Ti layer, TiN layer or a bilayer of these material layers. The conductive layer 310a may be formed of copper (Cu) or tungsten (W).

Embodiment 4

Figure 7:
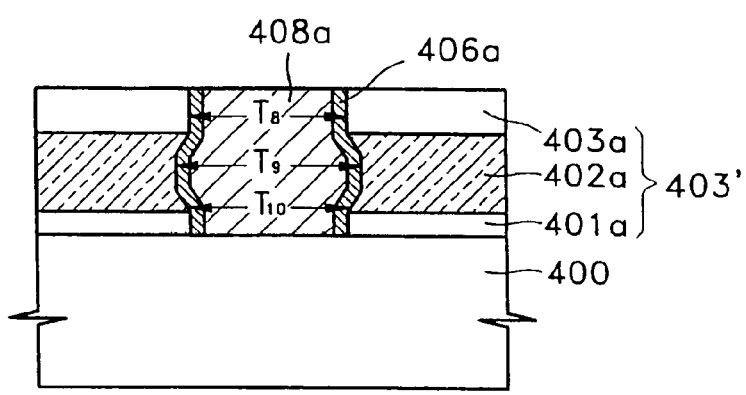

Another embodiment of a metal interconnect layer of a semiconductor device according to the present invention is shown in FIG. 7. Referring to FIG. 7, a trench whose middle width $T_9$ is larger than the upper and lower widths $T_8$ and $T_{10}$ is formed in an interlevel dielectric (ILD) film 403' deposited over a semiconductor wafer 400, and a barrier layer 406a is formed along the semiconductor wafer 400 with the trench. A conductive layer 408a is deposited to fill the trench with the barrier layer 406a. As a result, the middle width of the resulting conductive layer 408a is larger than the upper and lower widths thereof. The ILD film 403' includes a first insulation layer 401a, a second insulation layer 402a and a third insulation layer 403a, which are stacked in sequence. The widest middle portion of the conductive layer 408a is located in the second insulation layer 402a, and the relatively narrow lower and upper portions are located in the third and first insulation layers 403a and 401a, respectively. It is preferable that the thickness of the second insulation layer 402a be about 20–50% of the thickness of the entire ILD film 403'. The first and third insulation layers 401a and 403a are formed of a material layer, such as a USG layer, SiOF layer, TEOS layer, SOG layer or BPSG layer, having a lower etch rate than the second insulation layer 402a. The second insulation layer 402a is formed of a material layer such as a flowable oxide (FOX) layer or hydride organic siloxane polymer (HOSP) layer, having a higher etch rate and a smaller dielectric constant, compared with the first and third insulation layers 401a and 403a. In the present embodiment, the semiconductor wafer 400, the barrier layer 406a and the conductive layer 408a are formed of the same materials as used in Embodiment 3 described previously.

A method for forming a metal interconnect layer of a semiconductor device according to the present invention will be described by means of the following embodiments.

Method Embodiment 1

Figure 8A:
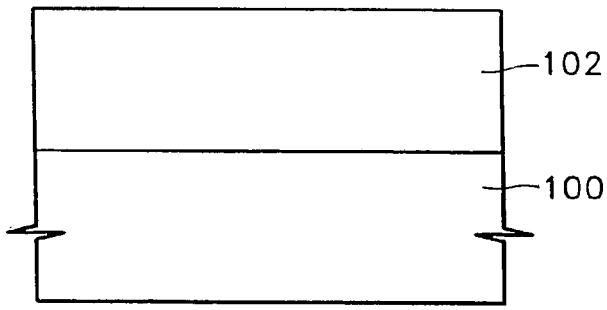
FIGS. 8A through 8D are schematic sectional views illustrating successive steps of the formation of a metal interconnect layer of a semiconductor device according to an embodiment of the present invention.

An embodiment of the metal interconnect formation according to the present invention is illustrated in FIGS. 8A through 8D. Referring to FIG. 8A, an ILD film 102 is formed over a semiconductor wafer 100. It is preferable that the ILD film 102 be formed of a USG layer, SiOF layer, TEOS layer, SOG layer or BPSG layer. The semiconductor wafer 100 may be a substrate as a stack of an insulation layer, such as a USG layer, SiOF layer, TEOS layer, SOG layer or BPSG layer, and a silicon nitride layer deposited in sequence over a predetermined underlying layer.

Figure 8B:
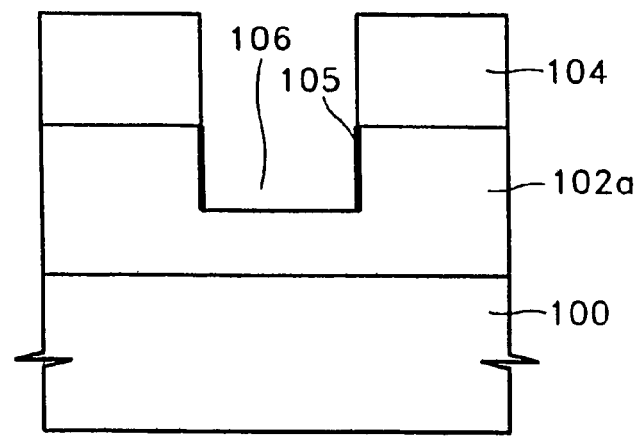

Referring to FIG. 8B, a photoresist pattern 104 is formed on the ILD film 102 by a photolighography process. A portion of the ILD film 102 is etched using the photoresist pattern 104 as an etching mask to form a shallow trench 106. A polymer layer 105 acting as an etch barrier is spontaneously formed on the sidewalls of the shallow trench 106. It is preferable that the height of the shallow trench 106 be about 20–70% of the thickness of the ILD film 102. For a general etching process, a CF-based gas such as $CHF_3$, $CF_4$, $C_4F_8$ or $C_3F_8$, and an inert gas such as Ar, He or Ne is used. Non-hydrogen containing CF-based gases suppress deposition of a polymer layer on the trench sidewalls, whereas hydrogen containing CF-based gases, such as $CHF_3$ gas, facilitates the deposition of the polymer layer. For this reason, in the present embodiment, the etching process is carried out using a hydrogen containing CF-based gas so that the polymer layer 105 is formed on the trench sidewalls. The polymer layer 105 serves as an etch barrier during a subsequent etching process, thereby preventing lateral etching.

Figure 8C:
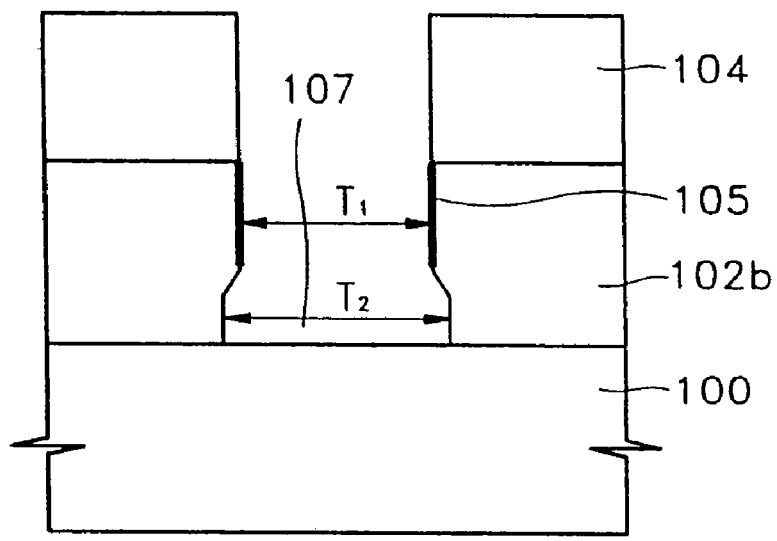

Referring to FIG. 8C, the ILD film 102a with the shallow trench 106 is further etched using the photoresist pattern 104 and the polymer layer 105 on the shallow trench sidewalls, as an etching mask, thereby resulting in a trench 107 whose lower width $T_2$ is larger than the upper width $T_1$. The lower portion of the ILD film 102a is etched with application of a lower bias voltage, compared with the etching of the upper portion for the shallow trench 106. During the etching to the lower portion of the ILD film 102a, irregular reflection of etchant species occurs on the exposed surface of the semiconductor wafer 100, causing the lower portion of the ILD film 102a to be etched in the lateral direction. As a result, the trench 107 whose lower width $T_2$ is larger than the upper width $T_1$ is formed.

The polymer layer 105 formed on the sidewalls of the shallow trench 106 acts as an etch barrier so that etching to only the lower portion of the ILD film 102a is allowed without causing lateral etching of the upper portion of the ILD film 102a. For the etching to the lower portion of the ILD film 102a, the above-mentioned non-hydrogen containing CF-based gases and inert gases are used, thereby preventing polymer deposition. Oxygen ($O_2$) and nitrogen ($N_2$) can prevent deposition of polymer: $O_2$ is more effective than $N_2$, for example, the effect of preventing the deposition of polymer by $O_2$ at 1 sccm is equivalent to the effect by $N_2$ at 15 sccm. For this reason, a gas mixture of $O_2$ or $N_2$, the CF-based gas, and inert gas is used in etching the lower portion of the ILD film 102a. The amount of $O_2$ is controlled in the range of 50–75% by weight of the CF-based gas, such that no polymer layer is deposited on the shallow trench sidewalls. $O_2$ produces CO or $CO_2$ by reaction with polymer, and $N_2$ produces cyanide (CN) gas by reaction with polymer, thereby preventing deposition of polymer. As a result, a trench 107 whose lower width $T_2$ is larger than the upper width $T_1$ is formed.

Figure 8D:
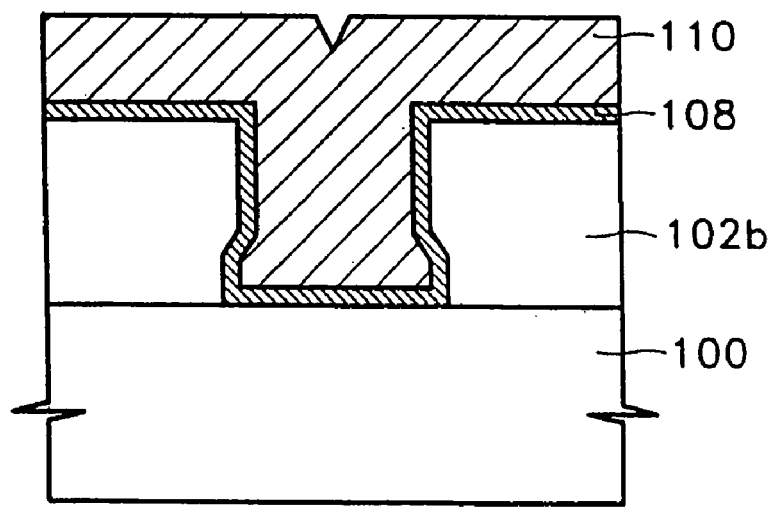

Referring to FIG. 8D, the photoresist pattern 104 used in etching the ILD film 102 is removed by a known method, for example, by ashing. Then, a barrier layer 108 is deposited along the semiconductor wafer 100 and within the trench 107. The barrier layer 108 may be formed of a material layer capable of acting as both a metal-diffusion barrier and an adhesive layer between the ILD film 102b and a conductive layer, for example, of a Ta layer, TaN layer, Ti layer, TiN layer or a bilayer of these material layers. Then, a conductive layer 110 is deposited over the semiconductor wafer 100 with the barrier layer 108. It is preferable that the conductive layer 110 be formed of Cu or W by electroplating, chemical vapor deposition (CVD) or sputtering, or by a combination of these methods. For example, a portion of the conductive layer 110 can be deposited over the barrier layer 108 by sputtering, and then the other portion can be deposited by electroplating.

The semiconductor wafer 100 with the conductive layer 108 is polished by chemical mechanical polishing (CMP) such that the conductive layer 108 remains within only the trench 107 surrounded by the ILD film 102b, thereby resulting in a metal connection, as shown in FIG. 4.

Method Embodiment 2

Figure 9A:
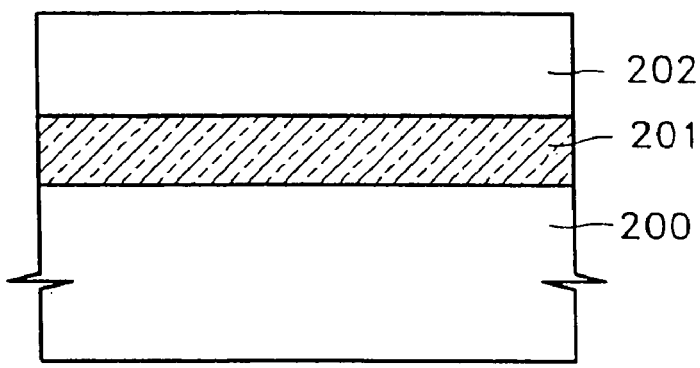
FIGS. 9A through 9D are schematic sectional views illustrating a method for forming a metal interconnect layer of a semiconductor device according to another embodiment of the present invention.

Another embodiment of the metal interconnect formation according to the present invention is illustrated by steps in FIGS. 9A through 9D. Referring to FIG. 9A, a first ILD film 201 and a second ILD film 202 are deposited over a semiconductor wafer 200 in sequence. It is preferable that the first ILD film 201 is formed of a material such as a FOX layer or HOSP layer, having a higher etch ratio and smaller resistance constant than those of the material for the second ILD film 202. The second ILD film 202 may be formed of a USG layer, SiOF layer, TEOS layer, SOG layer or BPSG layer. The thickness of the second ILD film 202 may be in the range of about 20–70% of the sum of the thicknesses of the first and second ILD films 201 and 202. The material used for the first ILD film 201, such as FOX layer or HOSP layer, has a smaller dielectric constant than the USG layer or SOG layer used as the second ILD film 201, thereby lowering parasitic capacitance of the resulting semiconductor device. The semiconductor wafer 200 may be a substrate in which an insulation layer such as USG layer, SiOF layer, TEOS layer, SOG layer or BPSG layer, and a silicon nitride layer are deposited in sequence over a predetermined underlying layer.

Figure 9B:
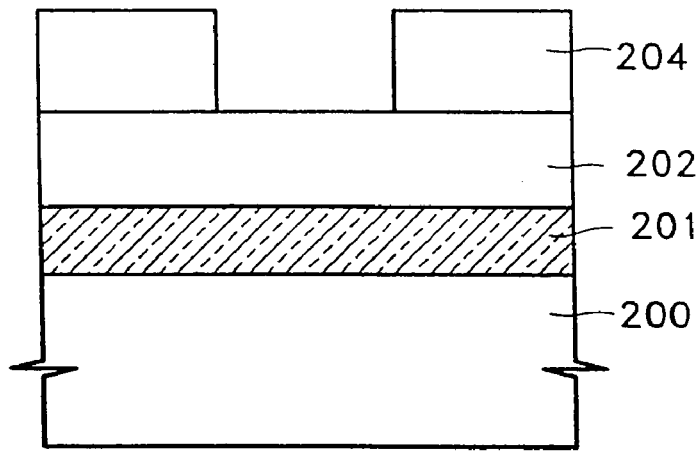
Figure 9C:
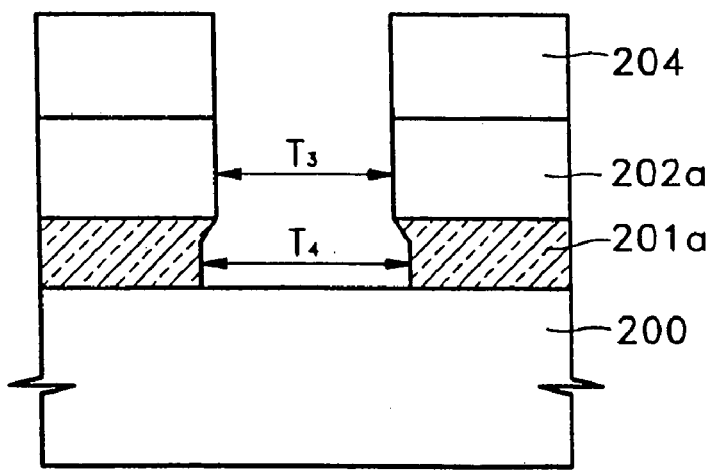

Referring to FIG. 9B, a photoresist pattern 204 which defines a metal interconnect region is formed on the second ILD film 202 by a photolithography process. Referring to FIG. 9C, the second and first ILD films 202 and 201 are etched in sequence using the photoresist pattern 204 as an etch mask, thereby resulting in a trench whose lower width $T_4$ in the first ILD film 201a is larger than the upper width $T_3$ in the second ILD film 202a. This is because the first ILD film 201 has a higher etch rate than the second ILD film 202.

Figure 9D:
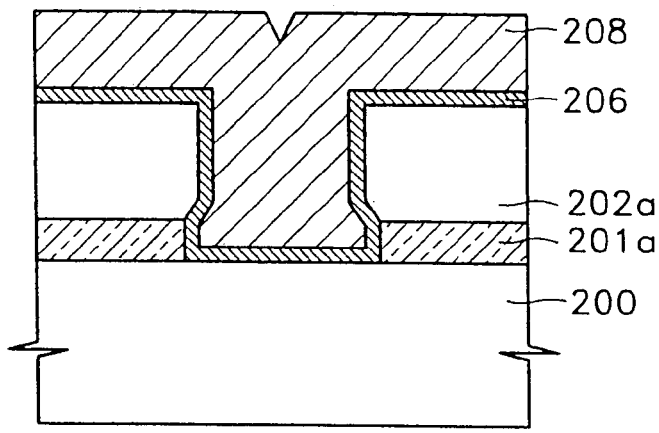

Referring to FIG. 9D, the photoresist pattern 204 is removed by a known method, for example, by ashing, and a barrier layer 206 is deposited along the semiconductor wafer 200 and within the trench. The barrier layer 206 may be formed of a material layer capable of acting as both a metal-diffusion barrier and an adhesive layer between the ILD films 201a and 202a and a conductive layer, for example, a Ta layer, TaN layer, Ti layer, TiN layer or a bilayer of these material layers. Then, a conductive layer 208 is deposited over the semiconductor wafer 200 with the barrier layer 206. It is preferable that the conductive layer 208 be formed of Cu or W by electroplating, CVD or sputtering, or by a combination of these methods. For example, a portion of the conductive layer 208 can be deposited over the barrier layer 206 by sputtering, and then the other portion can be deposited by electroplating.

The semiconductor wafer 200 with the conductive layer 208 is polished by CMP such that the conductive layer 208 remains within only the trench 107 in the ILD films 201 and 202, thereby resulting in a metal connection, as shown in FIG. 5.

Method Embodiment 3

Figure 10A:
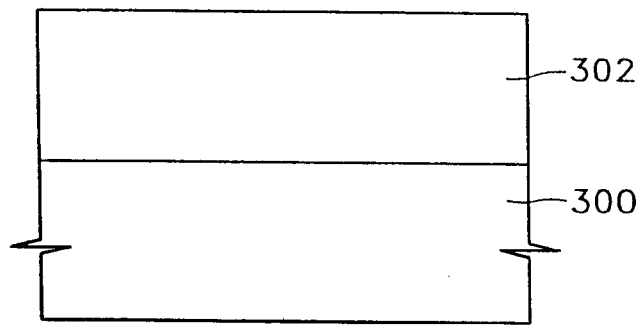
FIGS. 10A through 10D are schematic sectional views illustrating a method for forming a metal interconnect layer of a semiconductor device according to still another embodiment of the present invention.

Another embodiment of the metal interconnect formation according to the present invention is illustrated by steps in FIGS. 10A through 10D. Referring to FIG. 10A, an ILD film 302 is formed over a semiconductor wafer 300. It is preferable that the ILD film 302 be formed of a USG layer, SiOF layer, TEOS layer, SOG layer or BPSG layer. The semiconductor wafer 300 may be a substrate as a stack of an insulation layer, such as a USG layer, SiOF layer, TEOS layer, SOG layer or BPSG layer, and a silicon nitride layer deposited in sequence over a predetermined underlying layer.

Figure 10B:
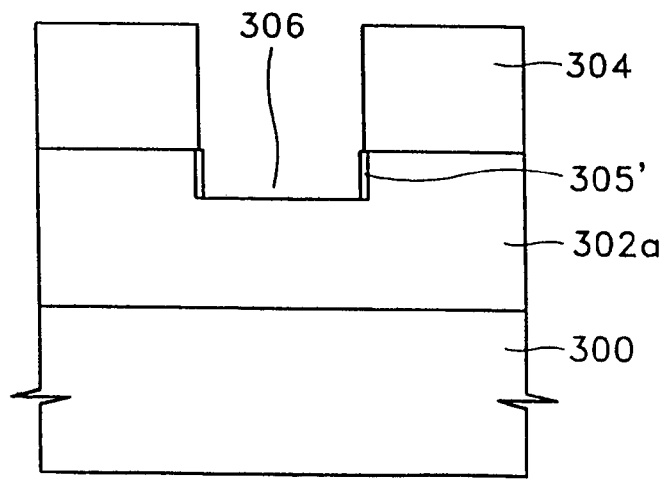

Referring to FIG. 10B, a photoresist pattern 304 that defines a metal interconnect region is formed on the ILD film 302 by a photolighography process. The upper portion of the ILD film 302 is etched using the photoresist pattern 304 as an etch mask to form a first trench 306. During the etching to the upper portion of the ILD film 302, a polymer layer 305' acting as an etch barrier is spontaneously formed on the sidewalls of the first trench 306. For a general etching process, CF-based gas such as $CHF_3$, $CF_4$, $C_4F_8$ or $C_3F_8$, and an inert gas such as Ar, He or Ne is used. Non-hydrogen containing CF-based gases suppress deposition of a polymer layer on the trench sidewalls, whereas hydrogen containing CF-based gases, such as $CHF_3$ gas, facilitates the deposition of polymer layer. For this reason, in the present embodiment, the etching process is carried out using a hydrogen containing CF-based gas so that the polymer layer 305' results on the trench sidewalls. The polymer layer 305' serves as an etch barrier during a subsequent etching process, thereby preventing lateral etching.

Figure 10C:
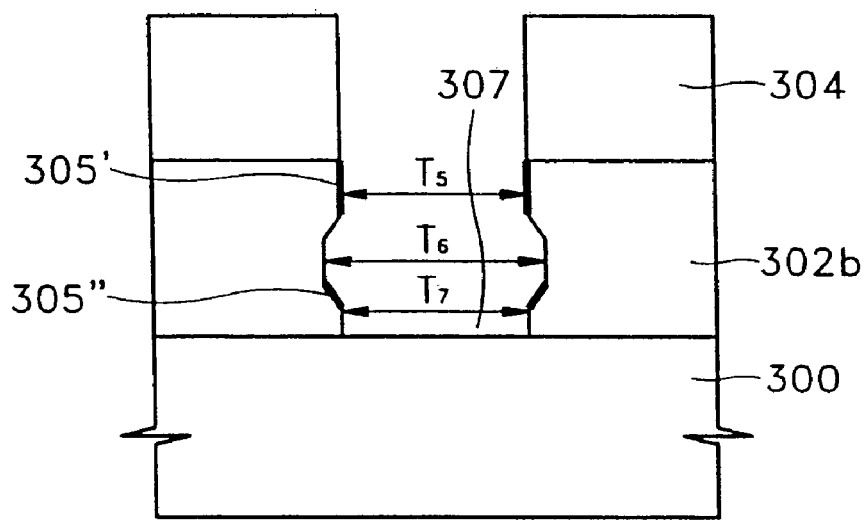

Referring to FIG. 10C, the middle portion of the ILD film 302a is etched using the photoresist pattern 304 and the polymer layer 305' on the upper sidewalls of the ILD film 302a as an etch mask, thereby resulting in a second trench whose width $T_6$ is larger than the upper width $T_5$. The polymer layer 305' formed on the upper sidewalls of the ILD film 302a acts as an etch barrier so that only etching downward is allowed without causing lateral etching of the upper portion of the ILD film 302b. At the same time, lateral etching occurs in the middle portion of the ILD film 302b with non-hydrogen containing etching gas. As the trench depth extends close to the end of the middle portion, a hydrogen-containing CF-based gas, such as $CHF_3$ gas, is supplied, so that a polymer layer 305" acting as an etch barrier, which prevents downward etching, is deposited at the end of the middle portion of a second trench. As a result, the second trench having width $T_6$ larger than the width $T_5$ of the first trench 306 is formed in the middle portion of the ILD film 302b. Following this, the remaining lower portion of the ILD film 302b is etched using the photoresist pattern 304, and the polymer layers 305' and 305" deposited on the sidewalls of the first and second trenches, as an etch mask, thereby resulting in a third trench 307 in the lower portion of the ILD film 302b, having a width $T_7$ smaller than the width $T_6$ of the second trench. The polymer layers 305' and 305" deposited on the sidewalls of the first and second trenches act as an etch mask, so that only downward occurs. In this case, it is preferable that the thickness of the middle portion of the ILD film 302b with the thickness $T_6$ is in the range of 20–50%% of the thickness of the entire ILD film 302b. Deposition of polymer can be suppressed during etching process, as described in the first embodiment.

Figure 10D:
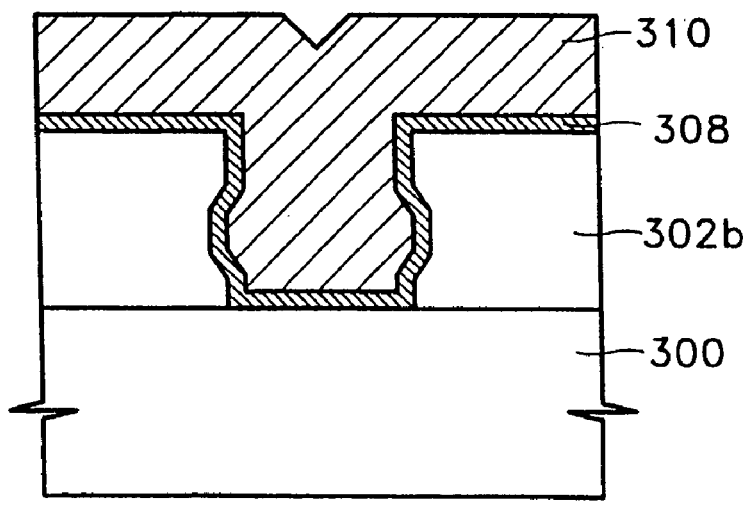

Referring to FIG. 10D, the photoresist pattern 304 used in etching the ILD film 302b is removed by a known method, for example, by ashing. Then, a barrier layer 308 is deposited along the semiconductor wafer 300 and within the trench. The barrier layer 308 may be formed of a material layer capable of acting as both a metal-diffusion barrier and an adhesive layer between the ILD film 302b and a conductive layer, for example, of a Ta layer, TaN layer, Ti layer, TiN layer or a bilayer of these material layers. Then, a conductive layer 310 is deposited over the semiconductor wafer 300 with the barrier layer 308. It is preferable that the conductive layer 310 be formed of Cu or W by electroplating, CVD or sputtering, or by a combination of these methods. For example, a portion of the conductive layer 310 can be deposited over the barrier layer 308 by sputtering, and then the other portion can be deposited by electroplating.

The semiconductor wafer 300 with the conductive layer 310 is polished by CMP such that the conductive layer 208 remains within only the trench surrounded by the ILD film 302b, thereby resulting in a metal connection, as shown in FIG. 6.

Method Embodiment 4

Figure 11A:
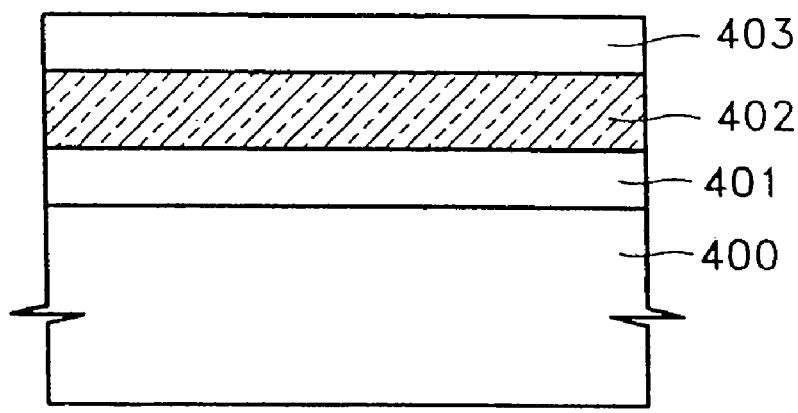
FIGS. 11A through 11D are sectional views illustrating a method for forming a metal interconnect layer of a semiconductor device according to yet still another preferred embodiment of the present invention.

Another embodiment of the metal interconnect formation according to the present invention is illustrated by steps in FIGS. 11A through 11D. Referring to FIG. 11A, a first ILD film 401 and a second ILD film 402 are deposited over a semiconductor wafer 400 in sequence. It is preferable that the first ILD film 401 be formed of a material, such as a USG layer, SiOF layer, TEOS layer, SOG layer or BPSG layer, having a lower etch ratio than that of the material for the second ILD film 402. The second ILD film 402 may be formed of a material, such as a FOX layer or HOSP layer, having a higher etching ratio and smaller dielectric constant than those of the material for the first ILD film 401. Since the FOX layer or HOSP layer used to form the second ILD film 402 has a smaller dielectric constant than that of the USG layer or SOG layer used to form the first ILD film 401, parasitic capacitance of the resulting semiconductor device decreases. Following this, a third ILD film 403 is formed over the second ILD film 402 with a material having a lower etch ratio than the second ILD film 402. It is preferable that the third ILD film 403 is formed of a USG layer, SiOF layer, TEOS layer, SOG layer or BPSG layer. The thickness of the second ILD film 402 may be in the range of about 20–50% of the sum of the thicknesses of the first, second and third ILD films 401, 402 and 403. The semiconductor wafer 400 may be a substrate in which an insulation layer such as USG layer, SiOF layer, TEOS layer, SOG layer or BPSG layer, and a silicon nitride layer are deposited in sequence over a predetermined underlying layer.

Figure 11B:
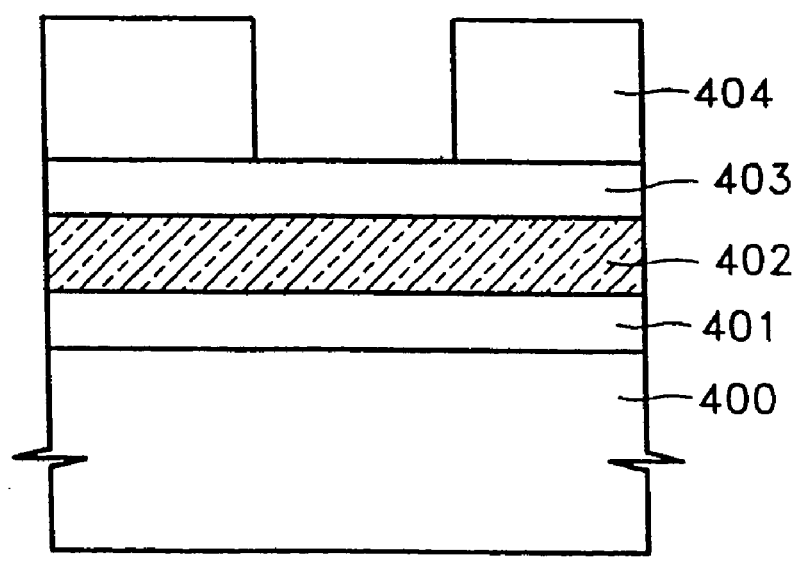
Figure 11C:
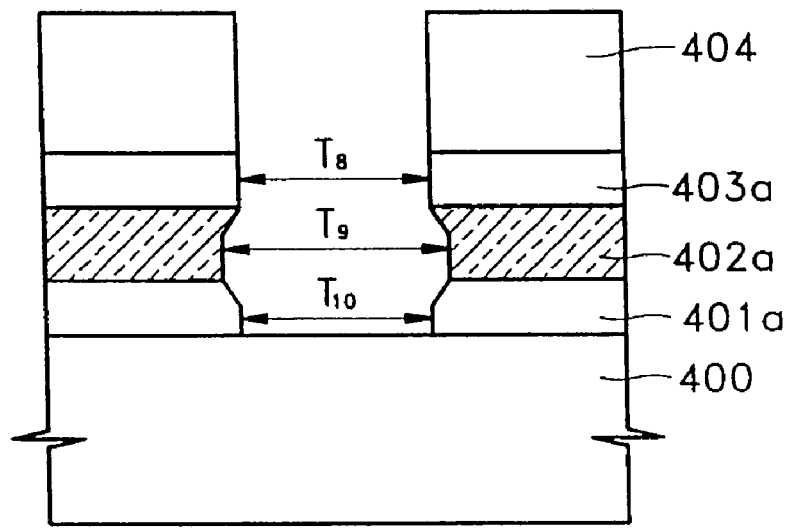

Referring to FIG. 11B, a photoresist pattern 404 which defines a metal interconnect region is formed on the third ILD film 403 by a photolithography process. Referring to FIG. 11C, the third, second and first ILD films 403, 402 and 401 are etched in sequence using the photoresist pattern 404 as an etch mask, thereby resulting in a trench whose middle width $T_9$ in the second ILD film 402a is larger than the upper width $T_8$ in the third ILD film 403a and the lower width $T_{10}$ in the first ILD film 401a. The middle width $T_9$ of the trench can be largest because the second ILD film 402 has a higher etch ratio compared with the third and first ILD films 403 and 401.

Figure 11D:
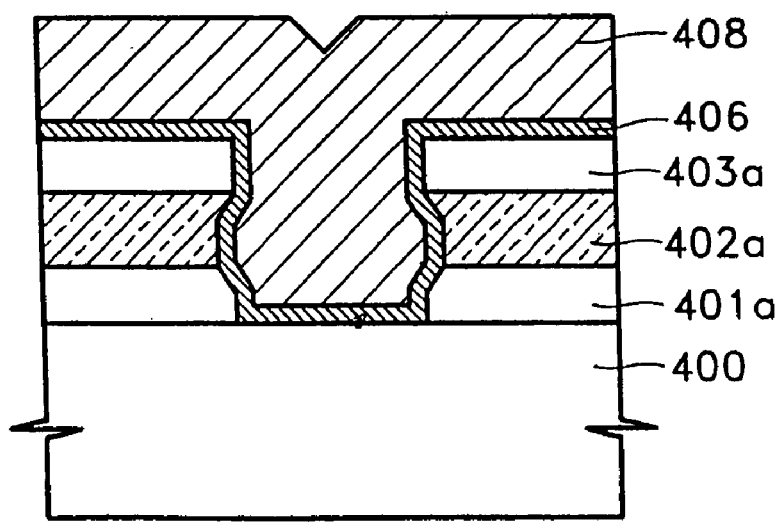

Referring to FIG. 11D, the photoresist pattern 404 used is removed by a known method, for example, by ashing, and a barrier layer 406 is deposited along the semiconductor wafer 400 with the trench. The barrier layer 406 may be formed of a material layer capable of acting as both a metal-diffusion barrier and an adhesive layer between the ILD films 401a, 402a and 403a, and a conductive layer, for example, of a Ta layer, TaN layer, Ti layer, TiN layer or a bilayer of these material layers. Then, a conductive layer 408 is deposited over the barrier layer 406. It is preferable that the conductive layer 408 is formed of Cu or W by electroplating, CVD or sputtering, or by a combination of these methods. For example, a portion of the conductive layer 408 can be deposited over the barrier layer 406 by sputtering, and then the other portion can be deposited by electroplating.

The semiconductor wafer 400 with the conductive layer 408 is polished by CMP such that the conductive layer 408 remains within only the trench 107 surrounded by the first, second and third ILD films 401a, 402a and 403a, thereby resulting in a metal connection, as shown in FIG. 7.

As previously mentioned, the metal interconnect structure of a semiconductor device and the metal interconnect formation according to the present invention can prevent lifting of metal interconnect. The inventive metal interconnect structure is wider at the lower portion than the upper portion, or at the middle portion than the upper and lower portions, so that lifting of the metal interconnect caused by stress applied to the ILD film during a subsequent thermal process can be suppressed. In addition, since the ILD film is formed of an insulation material having a low dielectric constant, parasitic capacitance of the semiconductor device becomes low.

While this invention has been particularly shown and described with references to preferred embodiments thereof, it will be understood by those skilled in the art that various changes in form and details may be made therein without departing from the spirit and scope of the invention as defined by the following claims.

The invention claimed is:

1. A metal interconnect layer for a semiconductor device, comprising:
   a first upper portion having a first width;
   a second middle portion having a second width, the second width being wider than the first width;
   a third lower portion having a third width, the third width being narrower than the second width;
   a conductive layer filling the first upper portion, the second middle portion, and the third lower portion, the conductive layer having a lower width, a middle width and an upper width, the middle width being wider than the upper and lower widths.

2. The metal interconnect layer of claim 1, wherein the metal interconnect layer comprises:
   a barrier layer deposited along an interlevel dielectric (ILD) film with a trench having a lower width, a middle width and an upper width, the middle width being wider than the upper and lower widths; wherein the conductive layer is deposited over the barrier layer, filling the trench.

3. The metal interconnect layer of claim 2, wherein the ILD film is formed as a single layer with a material layer selected from the group consisting of an undoped silicate glass (USG) layer, a silicon oxide fluoride (SiOF) layer, a tetraethylorthosilicate (TEOS) layer, a spin-on glass (SOG) layer and a borophosphosilicate glass (BPSG) layer.

4. The metal interconnect layer of claim 3, wherein the thickness of a middle portion of the ILD film surrounding a portion of the trench with the wider middle width is in the range of 20–50% of the thickness of the entire ILD film.

5. The metal interconnect layer of claim 2, wherein the barrier layer is formed of at least one of a Ta layer, TaN layer, Ti layer, TiN layer, and a bilayer of these material layers.

6. The metal interconnect layer of claim 1, wherein the conductive layer is formed of at least one of a Cu and a W layer.

7. A metal interconnect layer for a semiconductor device, comprising:
   a first upper portion having a first width;
   a second middle portion having a second width, the second width being wider than the first width;
   a third lower portion having a third width, the third width being narrower than the second width; and
   a barrier layer deposited along an interlevel dielectric (ILD) film with a trench having a lower width, a middle width and an upper width, the middle width being wider than the upper and lower widths; and a conductive layer deposited over the barrier layer, filling the trench, the conductive layer having a lower width, a middle width and an upper width, the middle width being wider than the upper and lower widths.

8. The metal interconnect layer of claim 7, wherein the ILD film is formed as a single layer with a material layer selected from the group consisting of an undoped silicate glass (USG) layer, a silicon oxide fluoride (SiOF) layer, a tetraethylorthosilicate (TEOS) layer, a spin-on glass (SOG) layer and a borophosphosilicate glass (BPSG) layer.

9. The metal interconnect layer of claim 8, wherein the thickness of a middle portion of the ILD film surrounding a portion of the trench with the wider middle width is in the range of 20–50% of the thickness of the entire ILD film.

10. The metal interconnect layer of claim 7, wherein the barrier layer is formed of at least one of a Ta layer, TaN layer, Ti layer, TiN layer, and a bilayer of these material layers.

11. The metal interconnect layer of claim 7, wherein the conductive layer is formed of at least one of a Cu and a W layer.

* * * * *